United States Patent [19]

Lay

[11] Patent Number: 5,384,307

[45] Date of Patent: Jan. 24, 1995

[54] OXIDE SUPERCONDUCTOR TAPE HAVING SILVER ALLOY SHEATH WITH INCREASED HARDNESS

[75] Inventor: Kenneth W. Lay, Schenectady, N.Y.

[73] Assignee: General Electric Company, Schenectady, N.Y.

[21] Appl. No.: 181,732

[22] Filed: Jan. 18, 1994

Related U.S. Application Data

[63] Continuation of Ser. No. 13,480, Jan. 29, 1993, abandoned, and a continuation of Ser. No. 787,421, Nov. 4, 1991, abandoned.

[51] Int. Cl.$^6$ .................. H01B 13/00; H01B 12/00
[52] U.S. Cl. .................. 505/430; 505/704; 505/500; 505/501; 29/599; 174/125.1; 427/62
[58] Field of Search .................. 505/1, 781, 742, 704, 505/430, 500, 501; 427/62, 63; 29/599; 174/125.1; 428/76

[56] References Cited

U.S. PATENT DOCUMENTS

| | | |
|---|---|---|
| 4,952,554 | 8/1990 | Jin et al. |
| 4,980,964 | 1/1991 | Boeke |
| 4,983,574 | 1/1991 | Meyer |
| 5,075,285 | 12/1991 | Flükiger .................. 505/1 |

FOREIGN PATENT DOCUMENTS

0357779  3/1990  European Pat. Off.

OTHER PUBLICATIONS

Hitachi Review vol. 39 (1990), No. 1, "Development of High—Tc Superconducting Wire with High Critical Current Density", T. Matsumoto et al, pp. 55–62.

Proceedings of the IEEE, vol. 77, No. 8, Aug. 1989, "Potential Methods for the Fabrication of High—Tc Superconductors for Wires and Cables," K. Tachikawa and K. Togano, pp. 1124–1131.

Primary Examiner—Roy V. King
Attorney, Agent, or Firm—James Magee, Jr.

[57] ABSTRACT

A method of forming the superconducting body comprises forming a body comprised of a precursor deposit of an oxide superconductor on a substrate formed from a silver alloy comprised of a solute metal from the group consisting of yttrium, aluminum, lithium, zirconium, alkaline earths, lanthanides, and mixtures thereof in an effective amount to form oxide particles that increase the hardness of the substrate, and the balance silver. The body is annealed in an oxidizing atmosphere to form the oxide particles in the substrate, and the deposit into a continuous oxide superconductor.

1 Claim, 1 Drawing Sheet

OXIDE SUPERCONDUCTOR TAPE HAVING SILVER ALLOY SHEATH WITH INCREASED HARDNESS

BACKGROUND OF THE INVENTION

This invention was made with Government support under Contract No. N00014-88-C-0681 awarded by the Department of the Navy. The Government has certain rights in the invention.

This application is a continuation of application Ser. No. 08/013,480, filed Jan. 29, 1993, now abandoned, and Ser. No. 07/787,421, filed Nov. 4, 1991, now abandoned.

This invention relates to superconducting bodies, and a method of forming a superconducting body of a high temperature oxide superconductor having a silver substrate, cladding, or sheath with increased hardness.

A new superconductor comprised of oxides of lanthanum, barium, and copper, and having a critical temperature of 30 Kelvin, K, was discovered at the Zurich laboratory of International Business Machines Corporation, J. G. Bednorz et al., "Possible High-$T_c$ Superconductivity in the Ba—La—Cu—O System," Z. Phys. V. 64, 189 1987. The discovery of the lanthanum-barium-copper-oxide system led to the discovery of a series of superconducting systems having a high critical temperature above 30 K. Exemplary of the newly discovered systems are, lanthanum-strontium-copper-oxide, yttrium-barium-copper-oxide, bismuth-strontium-calcium-copper-oxide, and thalium-barium-calcium-copper-oxide. The superconductors in the above systems, having a critical temperature above 30 K., are herein referred to as high temperature oxide superconductors or oxide superconductors. Additional information about the oxide superconductors and methods of forming powders or films thereof can be found, for example, in the following disclosures incorporated herein by reference, "Chemical Engineering and the Development of Hot Superconductors," R. Kumar, Chemical Engineering Progress, pp. 17–27, April 1990, and "Chemistry of High-Temperature Superconductors," A. W. Sleight, Science, Vol. 242, pp.1519–1527, December 1988.

The discovery of the oxide superconductors enables the development of superconducting equipment operating at temperatures up to liquid nitrogen cooling, about 77 K., instead of liquid helium cooling, about 4.2 K. Among the applications for such oxide superconductors are power transmission lines, rotating machinery, superconducting magnets, e.g. for, fusion generators, particle accelerators, levitated vehicles, magnetic separation, energy storage, and magnetic resonance imaging. These devices require the development of wire or tape of the oxide superconductors.

Owing to the brittleness and reactivity of oxide superconductors, it is advantageous to form metal-ceramic composites of the oxide superconductor on a metal substrate. The malleability of a metal cladding on oxide superconductor wires, tapes, and multifilaments compensates for the ceramics brittleness. Furthermore, the metal provides a good means of thermal dissipation, stabilizing the superconductor environment. The stabilizing effect is of fundamental importance for Type II superconductors, in which undesirably large local rises in temperature can develop through flux jumping in the mixed state. Flux jumping is a sudden, localized flux motion resulting in a local rise in temperature. Unfortunately, the Type II oxide superconductors, in particular, bismuth-lead-strontium-calcium-copper-oxide, react with nearly every metal with which they come into contact.

Silver has been found to be compatible with and non-poisoning to the superconducting systems yttrium-barium-copper-oxide, thallium-barium-calcium-copper-oxide, and bismuth-strontium-calcium-copper-oxide. It is also known that lead can be added to the bismuth system in order to stabilize the phase having a critical temperature of 110 K., comprised of bismuth, strontium, calcium, and copper oxides in the ratio of about 2:2:2:3, respectively. Such superconductor compositions and phases are sometimes herein shown by a formula, for example, $Bi_2Sr_2Ca_2Cu_3O_{10+y}$. The cation ratios given in such formulas usually indicate the ideal structure, and the exact oxygen content per molecular unit is nominal so that y varies within about a fraction of one. In addition, there may be substitution of cations on other sites, cation vacancies, or oxygen interstitials present so that the actual superconducting phase is not exactly that given by the ideal formula.

One of the most promising methods of forming oxide superconductors into long wires or tapes is the powder in tube drawing-rolling process, for example, see "Development of High-$T_c$ Superconducting Wire with High Critical Current Density", T. Matsumoto, K. Aihara, M. Seido, Hitachi Review, Vol. 39, (1990), No. 1, pp. 55–62, incorporated herein by reference. Briefly described, in this method superconducting powder was put into a 300 millimeter long silver tube with a 6 millimeter diameter and 0.5 millimeter wall thickness. The filled tube was drawn in 30 repetitions to a diameter of 2.8 millimeters. The drawn tubing was rolled into 6 millimeter wide tape 0.05 to 0.5 millimeters in thickness. For example, rolling was repeated about 100 times for a tape of 0.01 millimeter thickness. The tape was heat treated at 910° C. for twenty hours to react and sinter the core to form a continuous superconductor.

It has also been found that pressing oxide superconductor tape formed by the powder in tube method improves the current carrying capacity of the oxide superconductor. In contrast, a final rolling of the tape can cause elongation of the tape and cracking in the oxide superconductor core in a direction normal to the current flow, thereby reducing the current carrying capacity.

It is an object of this invention to provide an oxide superconductor body having improved formability and resistance to handling damage from a silver substrate having increased hardness.

It is another object of this invention to provide an elongate oxide superconductor body having a silver sheath with oxide particles dispersed therein.

It is an object of this invention to provide an improved method of forming an elongate silver sheathed body of the oxide superconductors having high current carrying capacity.

It is another object of this invention to provide a method of forming an elongate oxide superconductor silver sheathed body having increased sheath hardness.

It is another object of this invention to provide a method of forming an elongate oxide superconductor silver sheathed body where the reaction sintered oxide can be compacted by rolling to improve current carrying capacity.

BRIEF DESCRIPTION OF THE INVENTION

A superconducting body having improved formability and resistance to handling damage comprises a layer of an oxide superconductor formed on a substrate comprised of dispersed oxide particles of a solute metal from the group consisting of yttrium, zirconium, aluminum, lithium, titanium, alkaline earths, lanthanides, and mixtures thereof in an effective amount to increase the hardness of the substrate, and the balance silver.

A method of forming a superconducting body comprises forming a body comprised of a precursor deposit of an oxide superconductor on a substrate formed from a silver alloy comprised of a solute metal from the group consisting of yttrium, aluminum, lithium, titanium, zirconium, alkaline earths, lanthanides, and mixtures thereof in an effective amount to form oxide particles that increase the hardness of the substrate, and the balance silver. The body is annealed in an oxidizing atmosphere to form the oxide particles in the substrate, and the deposit into a continuous oxide superconductor.

As used herein, the term "precursor deposit", means an unsintered polycrystalline substantially phase pure material, or a mixture of polycrystalline partially reacted material and oxides that can be reacted to form the substantially phase pure material.

The following description of the invention can be understood with greater clarity if reference is made to the following drawings.

DETAILED DESCRIPTION OF THE INVENTION

Figure 1:
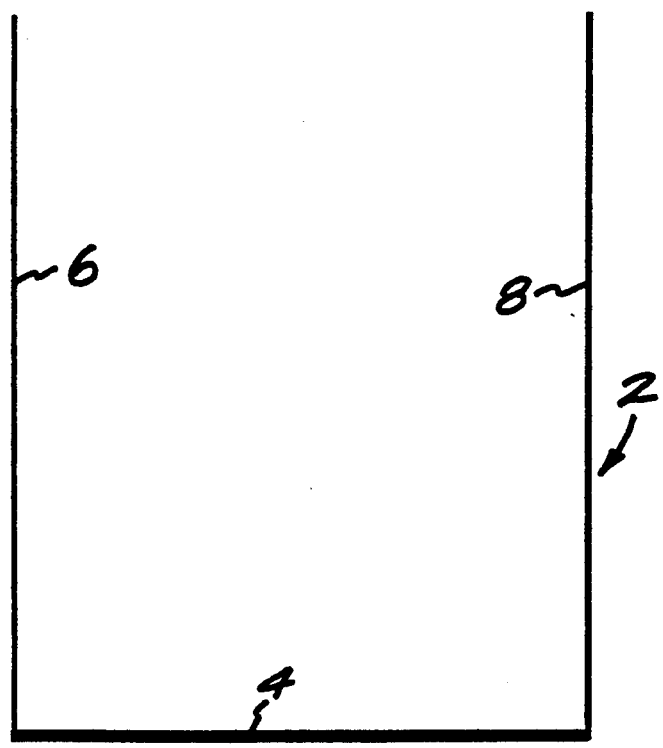
FIG. 1 is a cross-sectional view of a foil formed to receive a deposit.

I have discovered that the hardness and strength, of the silver substrate or sheath supporting an oxide superconductor, can be increased during the reaction sintering of the oxide superconductor. As a result, the formability and resistance to handling damage of the superconducting body is improved. At the same time the high ductility of silver is maintained in the substrate or sheath during the drawing and rolling operations performed prior to reaction sintering.

In addition, it is believed the reaction sintered superconductor formed in the hardened sheath can be improved in current carrying capacity by rolling. Prior art oxide superconducting bodies have a relatively soft silver sheathing, as compared to the hard and brittle sintered oxide core. The hardened silver sheathing of this invention is better able to transmit a rolling force to the sintered oxide core to affect further consolidation with minimal extension of the core, so that the current carrying capacity of the superconductor is improved.

Several ceramic oxide systems are known to be superconducting. Of particular interest are the alkaline earth cuprate systems containing yttrium, bismuth, or thallium. The yttrium system contains oxides of about 1 gram atom of yttrium or lanthanides, 2 gram atoms of barium, and 3 gram atoms of copper. The bismuth system contains oxides of about 2 gram atoms of bismuth, 2 gram atoms of strontium, 1 or 2 gram atoms of calcium, and 2 or 3 gram atoms of copper. The thallium system contains oxides of about 1 or 2 gram atoms of thallium, 2 gram atoms of barium, 1 or 2 gram atoms of calcium, and 2 or 3 gram atoms of copper.

A precursor powder of the oxide superconductor from the yttrium system, bismuth system, or thallium system can be formed by methods well known in the art. For example, the superconductors in the bismuth, thallium, or yttrium system can be prepared by solid state reaction of the oxides, or carbonates followed by sintering. Other methods, include coprecipitation from nitrate, acetate, or oxalate solutions and pyrolysis of metal organic precursors. Partial substitution of lead for bismuth in the bismuth system stabilizes the high temperature superconducting phases, and zero resistance above 100 K. has been observed in a system with the composition $Bi_{2-x}Pb_xSr_2Ca_2Cu_3O_{10}$, where $0.2 \leq x \geq 0.6$. The precursor powder can also be formed from a partly reacted powder of the desired superconductor. For example, a powder comprised of $Bi_2Sr_2CaCu_2O_{8+y}$ mixed with suitable amounts of PbO, and a pre-reacted mixture of strontium calcium copper oxides can be used. A deposit of the precursor powder is formed on a silver substrate, or after processing to form a silver sheath around a deposit of the precursor powder, the deposit can be heated to react the powder to form the superconductor $Bi_{2-x}Pb_xSr_2Ca_2Cu_3O_{10+y}$, where $0.2 \leq x \geq 0.6$.

The silver substrate or sheath is formed from a silver alloy comprised of a solute metal from the group consisting of yttrium, zirconium, aluminum, lithium, titanium, alkaline earths, and lanthanides in an effective amount to form oxide particles that increase the hardness of the body during subsequent annealing in an oxidizing atmosphere, and the balance silver. The effective amount will vary depending upon which solute metal is used to form the matrix strengthening oxides. The solute metal should be at least about 0.5 atomic percent, preferably at least about 1 atomic percent, up to an amount where matrix hardness ceases to increase when the solute metal is oxidized. For example, the upper limit is about 3 atomic percent for magnesium, about 4 atomic percent for berylium, and about 10 atomic percent for lithium. Preferably, the effective amount of the solute metal has minimal effect on the hardness and strength of the silver alloy prior to the reaction sintering in an oxidizing atmosphere, so that the high ductility of silver is maintained during the drawing and rolling steps to form the substrate or elongate sheath.

The silver alloy can be formed into a substrate such as a sheet by conventional melting, alloying, and thermomechanical processes such as cold rolling, because the silver alloy has a high ductility comparable to the ductility of silver. However, the strength and hardness of the silver alloy is substantially increased after exposure to the oxidizing atmosphere in annealing to reaction sinter the precursor deposit. The solute metal in the alloy is oxidized and oxide particles are formed that increase the hardness and strength of the alloy. The precursor deposit of the oxide superconductor can be formed on the substrate by conventional means, such as spray pyrolysis, sputtering, electron beam evaporation, and laser ablation.

The elongate oxide superconductor body of a precursor powder enclosed in a silver sheath can be formed by the conventional method, i.e., the powder in tube method, or by the method described in copending application Ser. No. 07/723,032, filed Jun. 28, 1991, now U.S. Pat. No. 5,192,739 incorporated herein by reference.

In the method of the '032 copending application, a silver tape is formed into a sheath that surrounds an oxide superconductor core. In the method of this invention, the silver tape is formed from the silver alloy described above. The silver tape has a thickness suitable for supporting the brittle oxide superconductor core. Preferably, the silver tape has sufficient thickness to provide a current shunt for the superconducting core. For example, the silver tape mechanically supports the relatively brittle oxide superconductor core so that the superconducting tape can be fabricated into a long wire or tape and formed, e.g., as windings in a magnet. A suitable silver tape is at least about 0.025 millimeters in thickness, and preferably is about 0.1 to 0.5 millimeters in thickness.

The precursor powder is poured onto a receiving surface formed in the silver tape to form a precursor deposit. Other techniques well known in the art can also be used to form the precursor powder into a precursor deposit. Tape casting and plastic extrusion can be used to form continuous lengths of the powder. Tape casting and plastic extrusion processes use a mixture of superconductor powder and an organic polymer mixture. The oxide powders are mixed with appropriate amounts of a dispersant, a binder, a plasticizer, and a solvent that is compatible with the other constituents of the mix. The cuprate oxide superconductors react with water and therefore, organic solvents are used. The dispersant is a surface-active agent which limits agglomeration of the powder. The binder gives strength to the green body, and the plasticizer lowers the glass-transition temperature of the binder to impart flexibility to the green body. A suitable organic polymer mixture is comprised of polyvinyl butyral resin as the binder and dispersant, di-isodecyl gluterate as the plasticizer, and methyl isobutyl ketone and toluene as solvents.

Figure 2:
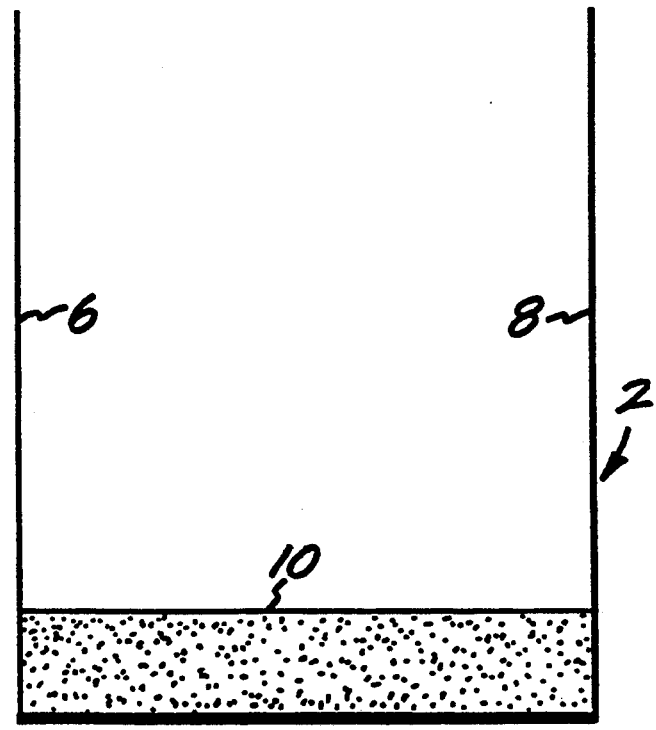
FIG. 2 is a cross-sectional view of the foil in FIG. 1, with a deposit formed thereon.
Figure 3:
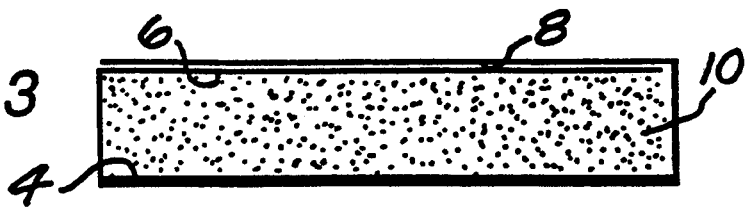
FIG. 3 is a cross-sectional view of the foil in FIG. 2, the foil having been wrapped around the deposit to form a sheath.

The method of the '032 copending application is shown by making reference to FIGS. 1-3. First referring to FIG. 1, a silver tape 2, is formed into a channel having a receiving surface 4, and enclosing surfaces 6 and 8. The combined thickness of enclosing surfaces 6 and 8 is equivalent to the thickness of receiving surface 4. For example, silver tape 2 is formed to have a central width portion having a first thickness of the receiving surface 4, and the outer portions of the tape width are half the thickness of receiving surface 4, i.e., enclosing surfaces 6 and 8. Alternatively, tape 2 has a uniform thickness across the width of the tape, and a second tape having the width of the receiving surface 4 and the same thickness as foil 2, is placed on the receiving surface 4 to form twice the thickness of enclosing surfaces 6 and 8.

Referring to FIG. 2, a precursor deposit 10 of the oxide superconductor is formed on receiving surface 4. When deposit 10 is comprised of an organic polymer mix, a decomposition anneal is preformed to decompose the polymer mix. Preferably, binders that decompose at temperatures below about 500° C. are used to minimize warping or deformation of tape 2. A suitable decomposition anneal comprises heating in air to about 500° C. at a rate of about 50° C. per hour to minimize blistering in the deposit. As shown in FIG. 3, enclosing surfaces 6 and 8 are wrapped or folded over deposit 10, and enclosing surface 8 overlaps enclosing surface 6. The overlapping enclosing surfaces 6 and 8 are sealed, for example, by light rolling.

Alternatively, the elongate superconducting body can be formed by the powder in tube method. A silver tube formed from the silver alloy described above is filled with the precursor powder of the oxide superconductor. The tube is sealed by caps bonded to the ends, and processed in a series of drawing, intermediate anneal, optional rolling, and annealing in the oxidizing atmosphere to reaction sinter the precursor powder and form a continuous oxide superconductor core in the elongated body. Additional information about processing in the powder in tube methods can be found in the disclosure of Matsumoto et al. cited above, or for example, in U.S. Pat. Nos. 4,983,574, 4,952,554, and 4,980,964, incorporated herein by reference.

The tape or elongate body formed by the powder in tube method, or the method of the '032 copending application, is reaction sintered by annealing methods well known in the art to form a continuous core of oxide superconductor in the body. For example, a precursor deposit of a yttrium system superconductor can be heated to about 900° to 1000° C., and bismuth or thallium system precursor deposits can be heated to about 800° to 900° C. to reaction sinter the precursor deposit and form the respective superconductors. The elongate body is annealed in an oxidizing atmosphere to form the oxide superconductor, and at the same time the solute metal in the silver sheath oxidizes and forms oxide particles dispersed therein.

A suitable oxidizing atmosphere is comprised of at least about 3 volume percent oxygen and the balance an inert atmosphere such as nitrogen or argon. Preferably, oxygen is about 3 to 14 volume percent of the oxidizing atmosphere. Nitrogen can be a preferred remainder of the atmosphere since it can form nitrides with some of the solute metals that provide additional hardening of the silver. The oxide particles provide precipitation strengthening in the silver matrix and increase the strength and hardness of the sheathing.

Additional information about annealing to form the oxide superconductors can be found, for example in, "Processing and Applications of High $T_c$ Superconductors," W. E. Mao, Editor, The Metallurgical Society, PA, 1988, incorporated herein by reference.

Additional features and advantages of the superconducting body, and method of this invention are shown in the following Example.

EXAMPLE 1

A first pure silver tape, and a second tape comprised of 0.0457 weight percent magnesium and the balance silver, were formed by conventional melting, casting, and rolling. The tapes were about 0.27 millimeters thick. The hardness of the tapes was measured after rolling using conventional Vickers diamond pyramid hardness testing in compliance with ASTM E92, 1990 Annual Book of ASTM Standards, Vol. 03.01. Samples of the first tape were heated in argon to about 650° C. in 1 hour, held at 650° C. for 30 minutes, cooled to room temperature, and the hardness was determined. Samples of the second tape were annealed at 830° C. in air for 48 hours, cooled to room temperature, and the hardness was determined. The anneal time and temperature for the second tape samples are typical of the reaction sinter heat treatment performed on oxide superconductors of the bismuth-strontium-calcium-copper oxide family.

A third tape was formed with a silver sheath of pure silver surrounding a core of bismuth-strontium-calcium-copper oxide by the conventional powder in tube process. Briefly described, powder with the overall composition $Bi_{1.7}Pb_{0.3}Sr_2Ca_{2.75}Cu_{3.75}O_y$ was poured into a silver tube having an outside diameter of 6.34 millimeters, and a wall thickness of about 1 millimeter. The tubes were sealed at both ends with silver plugs by swaging. The filled and sealed tube was swaged to a diameter of 4.21 millimeters, with 12 percent reductions in cross-section per pass. The swaged tube was drawn through a series of drawing dies to reduce the diameter to 1.52 millimeters, and form a wire. The drawing was performed with reductions of about 12 percent per pass. The drawn wire was rolled and flattened by repeated passing between spaced rolls. The roll spacing was reduced about 12 to 15 percent per pass to form a final tape having a width of about 3 millimeters, and a thickness of about 0.25 millimeter Samples of the third tape were annealed by the same heating schedules used to heat the samples of the first and second tapes, and the hardness of the silver sheathing on the tape was determined. Table I below shows the results of the hardness testing.

Table 1

Silver Tape Hardness

| Tape No. | | Vickers Harness | (Kg/mm²) |
| --- | --- | --- | --- |
| | | As Rolled | Argon Anneal | Air Anneal |
| 1 | Silver Tape | 88.8 | 44.3 | 37.2 |
| 2 | Ag Tape 2% Mg | 83.3 | 42.5 | 108.7 |
| 3 | Silver Sheath | 77.1 | 41.3 | 38.9 |

From the hardness test results shown above in Table 1 it can be seen that the silver tape comprised of 2 atomic percent magnesium is comparable in hardness to the pure silver tapes prior to the oxidizing anneal. However, the hardness of the silver tape comprised of 2 atomic percent magnesium is increased by about 280 percent when annealed in the oxidizing atmosphere used to reaction sinter the precursor deposit and form the continuous oxide superconductor core.

What is claimed is:

1. A method for making an oxide superconductor body comprising an oxide superconductor material in a precipitation hardened silver sheath which comprises reaction sintering, in an oxidizing atmosphere consisting essentially of about 3 to about 14 volume percent oxygen and a balance of an inert gas selected from the group consisting of argon and nitrogen, a precursor deposit of a ceramic oxide superconductor material in a sheath of a silver alloy comprising a solute metal selected from the group consisting of yttrium, zirconium, aluminum, lithium, alkaline earths, and lanthanides, in an amount of from about 0.5 to about 4 atomic percent to form finely divided solute metal oxide particles thereby increasing the hardness of the silver sheath through dispersion hardening during the reaction sintering, and forming a continuous oxide superconductor core within the dispersion hardened silver sheath.

* * * * *